United States Patent
Seong et al.

(10) Patent No.: US 10,212,820 B2
(45) Date of Patent: Feb. 19, 2019

(54) APPARATUS AND METHOD FOR REVERSE OFFSET PRINTING

(71) Applicant: LG CHEM, LTD., Seoul (KR)

(72) Inventors: Jiehyun Seong, Daejeon (KR); Seung Heon Lee, Daejeon (KR); Ji Young Hwang, Daejeon (KR); Yong Goo Son, Daejeon (KR)

(73) Assignee: LG CHEM, LTD., Seoul (KR)

( * ) Notice: Subject to any disclaimer, the term of this patent is extended or adjusted under 35 U.S.C. 154(b) by 999 days.

(21) Appl. No.: 14/402,265

(22) PCT Filed: May 31, 2013

(86) PCT No.: PCT/KR2013/004861
§ 371 (c)(1),
(2) Date: Nov. 19, 2014

(87) PCT Pub. No.: WO2013/180546
PCT Pub. Date: Dec. 5, 2013

(65) Prior Publication Data
US 2015/0173199 A1    Jun. 18, 2015

(30) Foreign Application Priority Data

May 31, 2012    (KR) .................. 10-2012-0058033

(51) Int. Cl.
| | | |
|---|---|---|
| *H05K 3/00* | (2006.01) | |
| *B41F 35/06* | (2006.01) | |
| *B41F 35/00* | (2006.01) | |
| *B41F 35/02* | (2006.01) | |
| *B41F 16/00* | (2006.01) | |
| *H05K 3/12* | (2006.01) | |

(52) U.S. Cl.
CPC ............. *H05K 3/007* (2013.01); *B41F 16/00* (2013.01); *B41F 35/00* (2013.01); *B41F 35/02* (2013.01); *B41F 35/06* (2013.01); *H05K 3/1275* (2013.01)

(58) Field of Classification Search
CPC ................................ B41F 35/00; B41F 35/06
USPC ..................................... 118/46, 203
See application file for complete search history.

(56) References Cited

U.S. PATENT DOCUMENTS

| | | | | |
|---|---|---|---|---|
| 3,661,079 | A * | 5/1972 | Stapleford | ................ B41F 7/04 |
| | | | | 101/142 |
| 5,662,041 | A * | 9/1997 | Kleist | ................... B41F 17/001 |
| | | | | 101/163 |
| 2007/0071884 | A1* | 3/2007 | Takeshita | ............ H01L 51/0004 |
| | | | | 427/66 |
| 2009/0314173 | A1 | 12/2009 | Nakamura et al. | |
| 2010/0050935 | A1* | 3/2010 | Roussillon | ............. C25D 17/00 |
| | | | | 118/58 |
| 2010/0089262 | A1 | 4/2010 | Seong et al. | |
| 2010/0139513 | A1 | 6/2010 | Seong et al. | |

FOREIGN PATENT DOCUMENTS

| | | |
|---|---|---|
| JP | 1984005356 U | 1/1984 |
| JP | 05-013746 | 1/1993 |
| JP | 05261887 A | 10/1993 |
| JP | 2566949 B2 | 10/1996 |
| JP | 2003-334919 A | 11/2003 |

(Continued)

*Primary Examiner* — Laura Edwards
(74) *Attorney, Agent, or Firm* — Dentons US LLP

(57) ABSTRACT

The present specification describes a reverse offset printing apparatus and a method.

12 Claims, 4 Drawing Sheets

(56) References Cited

FOREIGN PATENT DOCUMENTS

| | | | |
|---|---|---|---|
| JP | 2006-124546 | | 5/2006 |
| JP | 2006-281483 | | 10/2006 |
| JP | 2006281483 A | * | 10/2006 |
| JP | 2007083645 A | | 4/2007 |
| JP | 2007-125817 A | | 5/2007 |
| JP | 2007145027 A | | 6/2007 |
| JP | 2007-237413 | | 9/2007 |
| JP | 2007268714 A | | 10/2007 |
| JP | 2008-056884 | | 3/2008 |
| JP | 2009-148901 A | | 7/2009 |
| JP | 2009-172835 | | 8/2009 |
| JP | 2009241470 A | | 10/2009 |
| JP | 2010-23479 A | | 2/2010 |
| JP | 2010-082968 | | 4/2010 |
| JP | 4391574 B1 | | 4/2010 |
| JP | 2010520823 A | | 6/2010 |
| JP | 2012071506 A | | 4/2012 |
| KR | 10-0667882 | | 1/2007 |
| KR | 2008-0092707 A | | 10/2008 |
| KR | 10-2012-0062101 | | 6/2012 |

\* cited by examiner

[FIG. 1]
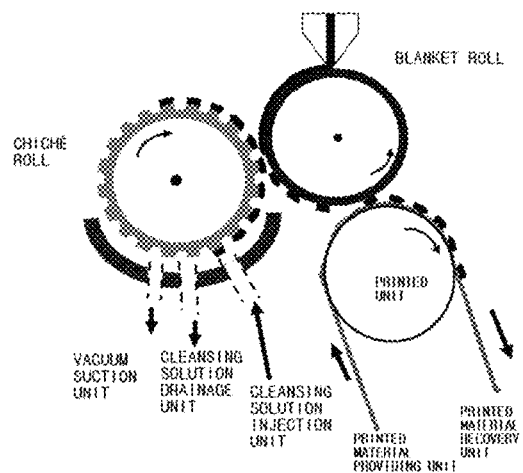
[FIG. 2]
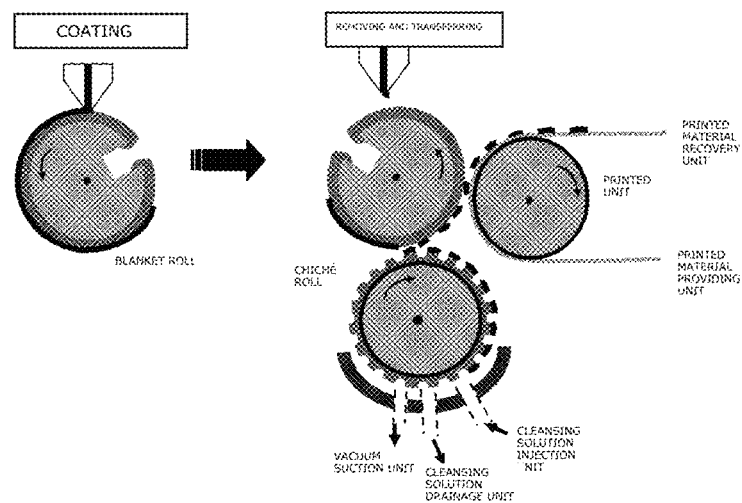

[FIG. 3]
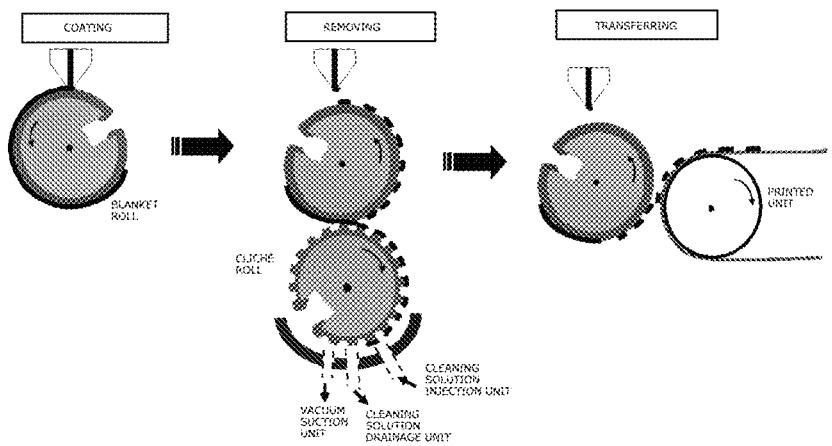
[FIG. 4]
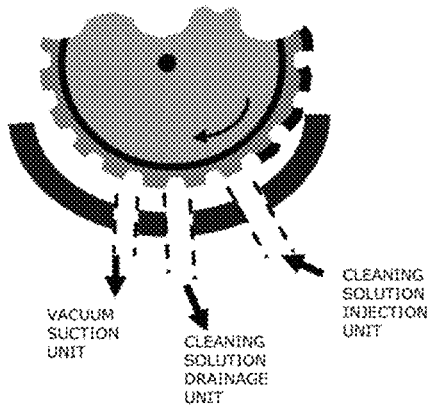
[FIG. 5]
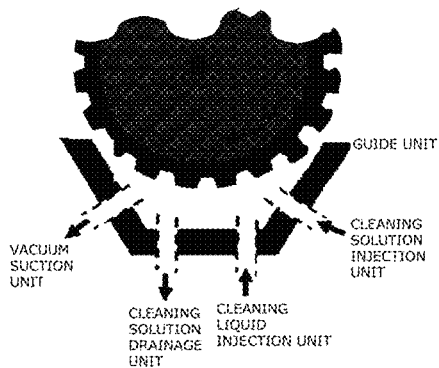

[FIG. 6]
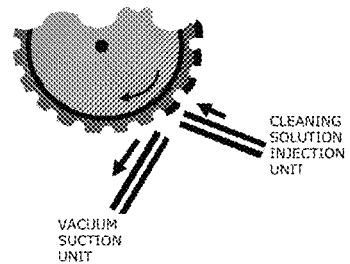
[FIG. 7]
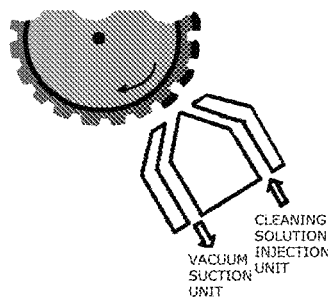
[FIG. 8]
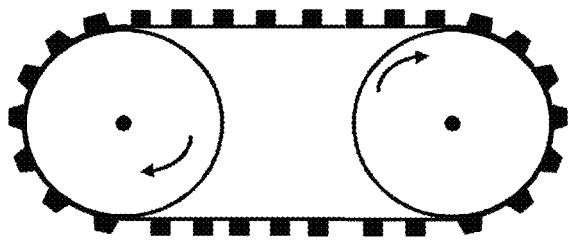

[FIG. 9]
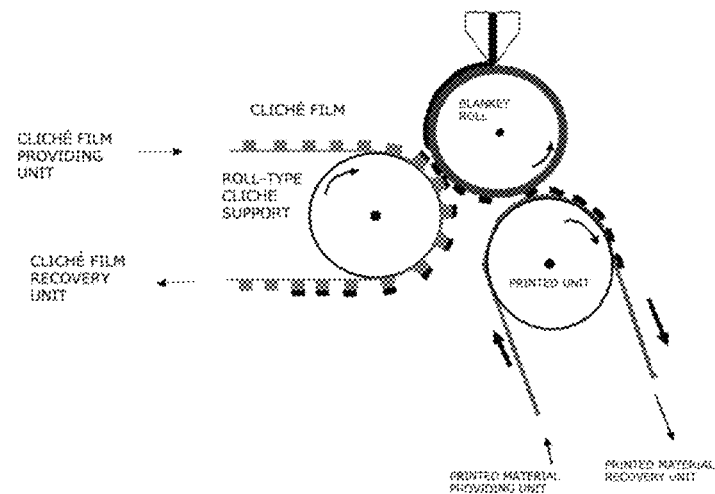
[FIG. 10]
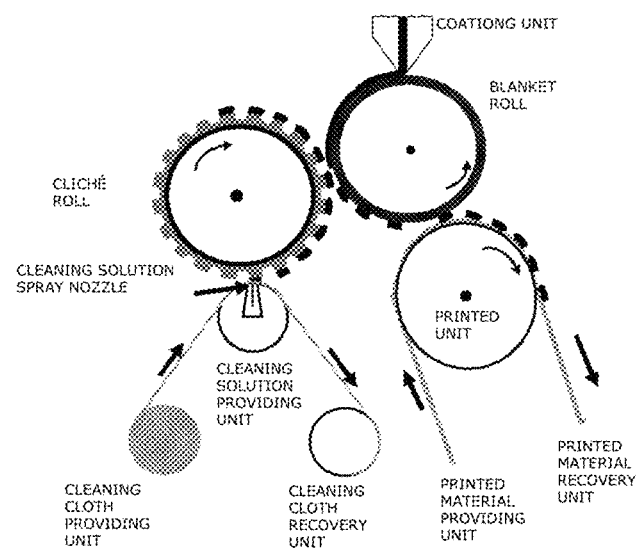

APPARATUS AND METHOD FOR REVERSE OFFSET PRINTING

This application is a National Stage Entry of International Application No. PCT/KR2013/004861, filed May 31, 2013, and claims the benefit of Korean Application No. 10-2012-0058033 filed on May 31, 2012, all of which are hereby incorporated by reference in their entirety for all purposes as if fully set forth herein.

TECHNICAL FIELD

The present specification describes a technology relating to a reverse offset printing apparatus and a method. This application claims priority to and the benefits of Korean Patent Application No. 10-2012-0058033, filed with the Korean Intellectual Property Office on May 31, 2012, the entire contents of which are incorporated herein by reference.

BACKGROUND ART

Various electronic material patterns are used for electronic products. For example, in displays, electronic material patterns having various functions are used for color filter substrates, transistor substrates, electrode substrates, and the like.

In order to form an electronic material pattern such as the above, methods such as a photolithography method, a plating method and a printing method have been tried.

Recently, as electronic material patterns used for electronic products are required to have a finer scale, there have been demands for materials, methods and apparatuses for forming an electronic material pattern.

DISCLOSURE

Technical Problem

In the related art, there have been demands for methods and apparatus for forming an electronic material pattern, which can minutely form an electronic material pattern or improve process efficiency.

Technical Solution

A first embodiment described in the present specification provides a reverse offset printing apparatus including a blanket roll; a coating unit provided to coat a printing composition on the blanket roll; a cliché roll that includes an uneven unit provided to form a pattern by being in contact with the outer peripheral surface of the blanket roll, and removing part of the printing composition coated on the blanket roll; a cliché roll cleaning unit provided to clean the uneven unit of the cliché roll while the cliché roll removes part of the printing composition coated on the blanket roll, which includes a cleaning solution injection unit and a vacuum suction unit; and a printed unit equipped with a printed material, and provided to transfer the printing composition pattern on the blanket roll to the printed material.

A second embodiment described in the present specification provides a reverse offset printing apparatus including a blanket roll; a coating unit provided to coat a printing composition on the blanket roll; a cliché roll that includes an uneven unit provided to form a pattern by being in contact with the outer peripheral surface of the blanket roll, and removing part of the printing composition coated on the blanket roll; a cliché roll cleaning unit provided to clean the uneven unit of the cliché roll while the cliché roll removes part of the printing composition coated on the blanket roll, which includes a cleaning cloth containing a cleaning solution and a support supporting the cleaning cloth to be in contact with the uneven unit of the cliché roll; and a printed unit equipped with a printed material, and provided to transfer the printing composition pattern on the blanket roll to the printed material.

A third embodiment described in the present specification provides a reverse offset printing apparatus including a blanket roll; a coating unit provided to coat a printing composition on the blanket roll; a cliché film that includes an uneven unit provided to form a pattern by being in contact with the outer peripheral surface of the blanket roll, and removing part of the printing composition coated on the blanket roll; a roll-type cliché support supporting the cliché film while the cliché film removes part of the printing composition coated on the blanket roll; a cliché film providing unit that provides the cliché film on the roll-type cliché support; a cliché film recovery unit that recovers the cliché film in which a pattern is formed by removing part of the printing composition coated on the blanket roll; and a printed unit equipped with a printed material, and provided to transfer the printing composition pattern on the blanket roll to the printed material.

A fourth embodiment described in the present specification provides a reverse offset printing method including the steps of coating a printing composition on a blanket roll; forming a printing composition pattern by bringing a cliché roll that includes an uneven unit in contact with the outer peripheral surface of the blanket roll coated with the printing composition, and removing part of the printing composition coated on the blanket roll; cleaning the uneven unit of the cliché roll with a cleaning solution injected from a cleaning solution injection unit while the cliché roll including the uneven unit forms the printing composition pattern by removing part of the printing composition coated on the blanket roll, and removing the cleaning solution by a vacuum suction unit; and transferring the printing composition on the blanket roll to a printed material.

A fifth embodiment described in the present specification provides a reverse offset printing method including the steps of coating a printing composition on a blanket roll; forming a printing composition pattern by bringing a cliché roll that includes an uneven unit in contact with the outer peripheral surface of the blanket roll coated with the printing composition, and removing part of the printing composition coated on the blanket roll; cleaning the uneven unit of the cliché roll using a cleaning cloth containing a cleaning solution and a support that brings the cleaning cloth in contact with the uneven unit of the cliché roll while the cliché roll including the uneven unit forms the printing composition pattern by removing part of the printing composition coated on the blanket roll; and transferring the printing composition on the blanket roll to a printed material.

A sixth embodiment described in the present specification provides a reverse offset printing method including the steps of coating a printing composition on a blanket roll; providing a cliché film that includes an uneven unit on a roll-type cliché support, forming a printing composition pattern by bringing the cliché film that includes the uneven unit in contact with the outer peripheral surface of the blanket roll coated with the printing composition and removing part of the printing composition coated on the blanket roll, and then recovering the cliché film including the uneven unit; and transferring the printing composition remaining on the blanket roll to a printed material.

Advantageous Effects

According to reverse offset printing apparatuses and methods of the embodiments described in the present specification, continuous or intermittent-continuous printing can be carried out since a roll-type cliché is used and a cliché can be cleaned at the same time during a printing process. As a result, process efficiency can be significantly improved, and a fully automated printing process can be accomplished.

DESCRIPTION OF DRAWINGS

FIG. 1 to FIG. 3 illustrate a reverse offset printing apparatus according to embodiments described in the present specification.

FIG. 4 to FIG. 7 illustrate a cliché roll cleaning unit of embodiments described in the present specification.

FIG. 8 illustrates the structure of a cliché roll cleaning unit of a reverse offset printing apparatus according to a first embodiment described in the present specification.

FIG. 9 illustrates a reverse offset printing apparatus according to a third embodiment described in the present specification.

FIG. 10 illustrates a reverse offset printing apparatus according to a second embodiment described in the present specification.

MODE FOR DISCLOSURE

Hereinafter, embodiments described in the present specification will be described in detail.

A reverse offset printing apparatus according to a first embodiment described in the present specification includes a blanket roll; a coating unit provided to coat a printing composition on the blanket roll; a cliché roll that includes an uneven unit provided to form a pattern by being in contact with the outer peripheral surface of the blanket roll, and removing part of the printing composition coated on the blanket roll; and a printed unit equipped with a printed material, and provided to transfer the printing composition pattern on the blanket roll to the printed material. Herein, the reverse offset printing apparatus further includes a cliché roll cleaning unit provided to clean the uneven unit of the cliché roll while the cliché roll removes part of the printing composition coated on the blanket roll, and the cliché roll cleaning unit includes a cleaning solution injection unit and a vacuum suction unit.

In the reverse offset printing apparatus according to the first embodiment, as long as the cliché roll cleaning unit is provided to clean the uneven unit of the cliché roll while the cliché roll removes part of the printing composition coated on the blanket roll, other constituents may be provided to operate simultaneously or consecutively.

One example structure of the reverse offset printing apparatus according to the embodiment is shown by a diagram in FIG. 1.

In the apparatus according to FIG. 1, it is constituted that coating a printing composition on a blanket roll, removing part of the printing composition coated on the blanket roll, and transferring the printing composition on the blanket roll to a printed material are carried out simultaneously. In this case, the blanket roll is disposed at a place where the outer peripheral surface borders each of the cliché roll and the printed material installed on the printed unit, which is also a place where coating is carried out by the coating unit.

Specific description of the apparatus of FIG. 1 is as follows.

In FIG. 1, the cliché roll includes an uneven unit on the surface. When the uneven unit is in contact with the outer peripheral surface of the blanket roll coated with a printing composition, part of the printing composition on the blanket roll is removed by being transferred on the protruding surface of the uneven unit. As a result, a printing composition pattern is formed on the blanket roll.

The uneven unit of the cliché roll is cleaned by a cliché roll cleaning unit after the ink is transferred on the protruding surface. With this, the cliché roll may be continuously used to remove part of the printing composition on the blanket roll. In other words, the uneven unit of the cliché roll may be continuously and repeatedly carried out the process of removing part of the printing composition on the blanket roll and being cleaned without the pause of cliché roll rotation. As a result, reverse offset printing may be carried out continuously. In addition, the printing process can be fully automated.

However, the embodiment is not limited to continuous printing. As necessary, the printing process may be temporarily suspended, or intermittent-continuously carried out. Herein, being intermittent-continuous means that printing process is progressed and stopped repeatedly and continuously at regular intervals. In addition, in the printing process, each specific process may be carried out consecutively.

The cliché roll cleaning unit may include a guide unit, and a cleaning solution injection unit and a cleaning solution drainage unit provided in the guide unit. The ink transferred to the uneven unit of the cliché roll is cleaned using a cleaning solution injected through the cleaning solution injection unit, and the cleaning solution after the cleaning can be discharged through the cleaning solution drainage unit. When the injection of the cleaning solution is carried out using a spray method, cleaning can be carried out more effectively.

On the blanket roll, part of the printing composition is removed by the cliché roll, and a printing composition pattern is formed. The printing composition pattern on the blanket roll is transferred to a printed material installed on the printed unit. In FIG. 1, a film-type printed material is provided on the outer peripheral surface of the roll-type printed unit, and the printed material, while being supported by the printed unit, is in contact with the outer peripheral surface of the blanket roll. As a result, the printing composition pattern on the blanket roll is transferred to the printed material.

In FIG. 1, a roll-type printed unit is shown by the diagram, but the printed unit is not limited thereto. The printed unit may be a flat plate type.

Another example structure of a reverse offset printing apparatus according to the embodiment is shown by a diagram in FIG. 2.

In the apparatus according to FIG. 2, it is constituted that, after a printing composition is coated on a blanket roll, removing part of the printing composition on the blanket roll and transferring the printing composition pattern to a printed material are carried out simultaneously. In this case, the blanket roll may be disposed to be movable between a place where coating is carried out by the coating unit, and a place where the outer peripheral surface borders each of the cliché roll and the printed material installed on the printed unit. By this constitution, after the blanket roll is coated by a coating unit, it moves to a place where its outer peripheral surface borders each of the cliché roll and the printed material installed on the printed unit, and then subsequent processes may be carried out. The descriptions on the apparatus according to FIG. 2 are the same as those in FIG. 1 except that the blanket roll is disposed to be movable as described above.

In the apparatus according to FIG. 2, after the printing composition is coated on the blanket roll, moving means may be additionally provided to move the blanket roll to a place bordering each of the cliché roll and the printed unit.

An apparatus such as that shown by a diagram in FIG. 2 is useful when it is necessary to adjust the speed of coating a printing composition and the speed of removing part of the printing composition by the cliché roll differently, or when it is necessary to have a waiting time after the printing composition is coated on the blanket roll. In addition, an apparatus of FIG. 1 or FIG. 2 may be selected considering the spatial environment of the printing.

In FIG. 2, as in FIG. 1, a roll-type printed unit is shown by the diagram, however, the printed unit is not limited thereto. The printed unit may be a flat plate type.

Another example structure of a reverse offset printing apparatus according to the embodiment is shown by a diagram in FIG. 3.

In the apparatus according to FIG. 3, it is constituted that coating a printing composition on a blanket roll, removing part of the printing composition on the blanket roll and transferring the printing composition pattern to a printed material are carried out separately. The descriptions on the apparatus according to FIG. 3 are the same as those in FIG. 1 except that, in the apparatus according to FIG. 3, the three processes are carried out separately. In this case, the blanket roll may be disposed to be movable between a place where coating is carried out by the coating unit, a place where the outer peripheral surface borders the cliché roll, and a place where the outer peripheral surface borders the printed material installed on the printed unit. By this constitution, after the blanket roll is coated by a coating unit, is moved to a place where the outer peripheral surface borders the cliché roll, and forms a printing composition pattern, the blanket roll is subsequently moved to a place where the outer peripheral surface borders the printed material installed on the printed unit enabling the pattern transfer of the printing composition. The descriptions on the apparatus according to FIG. 3 are the same as those in FIG. 1 except that the blanket roll is disposed to be movable as described above.

In the apparatus according to FIG. 3, moving means may be additionally provided to move the blanket roll from a place where the printing composition is coated on the blanket roll to a place bordering the cliché roll and a place bordering the printed material installed on the printed unit.

An apparatus such as that shown by a diagram in FIG. 3 is useful when it is necessary to adjust the speed of coating a printing composition, the speed of removing part of the printing composition by the cliché roll, and the speed of transferring the printing composition to a printed material differently, or when it is necessary to have a waiting time after the printing composition is coated on the blanket roll and/or after the printing composition pattern is formed on the blanket roll. In addition, an apparatus of FIG. 1, FIG. 2 or FIG. 3 may be selected considering the spatial environment of the printing.

In FIG. 3, as in FIG. 1, a roll-type printed unit is shown by the diagram, but the printed unit is not limited thereto. The printed unit may be a flat plate type.

Although it is not shown in the drawings, a reverse offset printing apparatus according to the embodiment may be constituted to simultaneously coat a printing composition on a blanket roll and remove part of the printing composition on the blanket roll, and subsequently transfer the printing composition pattern to a printed material. In this case, the blanket roll may be disposed to be movable between a place where the outer peripheral surface borders the cliché roll, which is also a place where coating is carried out by the coating unit, and a place where the outer peripheral surface borders the printed material installed on the printed unit. By this constitution, after coating is carried out by the coating unit and removing part of the printing composition is carried out by a cliché roll, the blanket roll is moved to a place where the outer peripheral surface borders the printed material installed on the printed unit, and then subsequent processes may be carried out. The descriptions on this apparatus are the same as those in FIG. 1 except that the blanket roll is disposed to be movable as described above.

In the embodiment, the structure of the cliché roll cleaning unit is not particularly limited as long as it can clean the cliché roll while the cliché roll forms a printing composition pattern by removing part of the printing composition on the blanket roll. Therefore, the structure of the cliché roll cleaning unit can be modified as necessary. The structures of the cliché roll cleaning unit are illustrated in FIG. 4 to FIG. 7.

The vacuum suction unit can remove the cleaning solution by vacuum suction, which is stronger than air injection, therefore, the cleaning solution can be removed more reliably in a short time, quicker drying is possible compared to air injection, it is particularly advantageous in a continuous process, and a problem of vapor presence in a solvent, which occurs in injecting air, does not occur.

According to FIG. 4, the cliché roll cleaning unit includes a vacuum suction unit, a guide unit, a cleaning solution injection unit and a cleaning solution drainage unit provided in the guide unit.

When the cleaning solution is injected through the cleaning solution injection unit, the guide unit plays the role of preventing the cleaning solution affecting other processes while the cleaning solution is drained to the cleaning solution drainage unit after cleaning the cliché roll. The material or the structure of the guide unit may be selected considering the type of the cleaning solution and a spatial arrangement with surrounding apparatuses. For example, as in FIG. 4, the guide unit may have a form surrounding the lower section of the cliché roll with separated distances.

The structure or the size of the cleaning solution injection unit is not particularly limited as long as it has a form capable of cleaning the cliché roll by injecting a cleaning solution. When the cleaning solution is injected using a spray method through the cleaning solution injection unit, the cliché roll can be effectively cleaned.

The structure or the size of the cleaning solution drainage unit is not particularly limited as long as it has a structure capable of draining a cleaning solution after the cleaning solution is injected through the cleaning solution injection unit and cleans the cliché roll. However, it is preferable that the cleaning solution drainage unit be provided at the floor surface or the lowest place of the guide unit so that the cleaning solution is effectively drained after the cleaning.

In the embodiment, the vacuum suction unit is located next to the cleaning solution drainage unit on the guide unit, following the progress direction of the cliché roll.

In the embodiment, the distance between the vacuum suction unit and the cleaning solution drainage unit is smaller than the limit that does not interrupt the rotation of the cliché roll due to the size of the guide unit becoming larger than necessary.

The distance described above means the shortest distance between the center of gravity of the cross section formed by the highest point among the boundary surface of the vacuum suction unit based on the ground and the center of gravity of the cross section formed by the highest point among the boundary surface of the cleaning solution drainage unit based on the ground.

In the embodiment, the distance between the vacuum suction unit and the cleaning solution drainage unit is greater than the limit of the mixture of the cleaning solution and an ink fragment smeared to an embossing unit of the cliché roll being adsorbed to the vacuum suction unit.

When the ink fragment residue smeared to the embossing unit of the cliché roll is adsorbed to the vacuum adsorption unit, the vacuum adsorption unit is contaminated, and therefore, the vacuum adsorption unit can be clogged.

In the embodiment, the distance between the vacuum suction unit and the cleaning solution drainage unit is greater than or equal to 2 cm and less than or equal to 20 cm.

When the distance is 2 cm or larger, the ink fragment, which is mixed with a solution to be drained to the cleaning solution drainage unit after the cliché roll is cleaned, is suctioned to a vacuum suction unit, and therefore, the vacuum suction unit is not contaminated. When the distance is 20 cm or smaller, the guide unit does not interrupt the rotation of the cliché roll occurring due to the size of the guide unit becoming larger than necessary, and the time until the drying of the cleaning solution remaining on the cliché roll by vacuum suction after the cleaning of the cliché roll is sufficient, therefore, an incompletely dried cleaning solution does not remain on the cliché roll as a stain.

According to FIG. 5, the cliché roll cleaning unit additionally includes a cleaning liquid injection unit comparing to FIG. 4. By additionally including the cleaning liquid injection unit, cleaning with a cleaning liquid can be additionally carried out following the cleaning with a cleaning solution. The cleaning solution can be removed for certain by the additional cleaning with the cleaning liquid. The cleaning liquid may be distilled water, or a liquid having larger volatility than a cleaning solution, and examples thereof include acetone or ethanol.

The cliché roll cleaning unit may include a cleaning solution injection unit and a vacuum suction unit without a guide unit or a cleaning solution drainage unit.

The vacuum pressure of the vacuum suction unit may be different depending on the vapor pressure of a cleaning solution, and the distance between the cliché roll and the vacuum suction unit.

The vacuum pressure of the vacuum suction unit may be greater than or equal to 0.01 mmHg, and less than or equal to 400 mmHg.

When the vacuum pressure of the vacuum suction unit is greater than or equal to 0.01 mmHg, costs to remove the cleaning solution do not increase, and when the vacuum pressure is less than or equal to 400 mmHg, the cleaning solution is easily removed.

According to FIG. 6, the cliché roll cleaning unit includes a pipe provided with a cleaning solution injection unit and a pipe provided with a vacuum suction unit without a guide unit. The cleaning solution injected through the cleaning solution injection unit is removed by the vacuum suction unit immediately after the cliché roll is cleaned. In this structure, the cleaning solution can be removed by adjusting the vacuum suction strength in the vacuum suction unit without the drainage of the cleaning solution.

According to FIG. 7, the cliché roll cleaning unit includes a cleaning solution injection unit and a vacuum suction unit provided in one body. The same operational principle as the structure illustrated in FIG. 6 may be applied except that a cleaning solution injection unit and a vacuum suction unit are all provided in one body.

In the embodiment, the materials and constitutions of the blanket roll is not particularly limited as long as a printing composition can be coated on the outer peripheral surface of the blanket roll, part of the printing composition can be removed by the uneven unit of the cliché roll, and the printing composition pattern remaining on the outer peripheral surface can be transferred to a printed material. For example, the blanket roll may include a roll-type support and a blanket covering the outer peripheral surface of the roll-type support. Herein, the materials, the thicknesses, or the surface characteristics of the blanket may be selected depending on the types of a printing composition, a cliché roll and a printed material to be used. For example, silicone-based rubber may be used as the blanket. The blanket may be adhered to the roll-type support using an adhesive or an adhesive tape, however, may be adhered by an adhesive force between the roll-type support and the blanket materials, or methods of physically fixing the support and the materials may also be used.

In the embodiment, the structure of the coating unit is not particularly limited as long as a printing composition can be coated on the blanket roll.

In the embodiment, the cliché roll has an uneven unit on which a pattern, which is to be formed on a printed material, is formed by engraving. In the cliché roll, the uneven unit may be directly formed on the surface of the roll-type support, or a resin film having an uneven unit may be adhered to the roll-type support. The resin film is flexible so that it can be supported by the roll-type support, and includes an uneven unit so that the printing composition on the blanket roll can be removed. At this time, the resin film may be adhered using an adhesive or an adhesive tape, however, may be adhered by an adhesive force between the resin film and the roll-type support materials, or methods of physically fixing the film and the materials may also be used.

The uneven unit provided in the resin film may be prepared to have a continuous pattern using a curable resin such as a UV-curable resin.

When the cliché roll includes a roll-type support and a resin film adhered thereon, the cliché roll may include one roll-type support, but may also include two or more roll-type supports. For example, the cliché roll may have a structure in which a resin film having an uneven unit is installed on two roll-type supports provided to rotate in the same direction and separately disposed parallel to each other. This structure is illustrated in FIG. 8. In this case, part of the printing composition may be removed in the resin film area supported by any one roll-type support, and the printing composition on the uneven unit may be cleaned in the resin film area supported by another roll-type support.

In the embodiment, the printed unit may be a roll type, or a flat plate type. When the printed unit is a roll type, a film-type printed material may be used. When the printed unit is a flat plate type, the printed material may be film-type, but may also be substrate-type. The printed unit may additionally include a printed material providing unit to install a printed material on the printed unit, and a printed material recovery unit to recover the printed material after printing is complete. When the printed material is film-type, the printed material providing unit and the printed material recovery unit may have a constitution to provide and recover the printed material either continuously or intermittent-continuously by each of them being operated continuously. For example, the printed material providing unit is an unwinding unit of the film-type printed material, and the printed material recovery unit is a rewinding unit of the film-type printed material.

In the embodiment, when a pattern is formed by removing part of the printing composition on the blanket roll, the blanket roll and the cliché roll are disposed so that their outer peripheral surfaces border to each other, and are provided to rotate in the opposite direction to each other. At this time, when the rotation speed of the blanket roll and the cliché roll is adjusted so that the moving speed at the contact point of the cliché roll and the blanket roll is the same, the precision of a printed pattern can be further improved. Therefore, a control unit, which adjusts the rotation speed of the cliché roll and the blanket roll so that the moving speed at the contact point of the cliché roll and the blanket roll is the same, may be further included.

In the embodiment, when the printed unit is a roll type and when the printing composition pattern on the blanket roll is transferred to the printed material installed on the printed unit, the blanket roll is disposed so that the outer peripheral surface borders the printed material installed on the roll-type printed unit, and the blanket roll and the roll-type printed unit are provided to rotate in the opposite direction to each other. At this time, when the rotation speed of the blanket roll and the roll-type printed unit is adjusted so that the moving speed at the contact point of the blanket roll and the printed material installed on the roll-type printed unit is the same, the precision of a printed pattern can be further improved. Therefore, a control unit, which adjusts the rotation speed of the blanket roll and the printed material installed on the roll-type printed unit so that the moving speed at the contact point of the blanket roll and the printed material installed on the roll-type printed unit is the same, may be further included.

A reverse offset printing apparatus according to a second embodiment described in the present specification includes a blanket roll; a coating unit provided to coat a printing composition on the blanket roll; a cliché roll that includes an uneven unit provided to form a pattern by being in contact with the outer peripheral surface of the blanket roll, and removing part of the printing composition coated on the blanket roll; a cliché roll cleaning unit provided to clean the uneven unit of the cliché roll while the cliché roll removes part of the printing composition coated on the blanket roll, which includes a cleaning cloth containing a cleaning solution and a support supporting the cleaning cloth to be in contact with the uneven unit of the cliché roll; and a printed unit equipped with a printed material, and provided to transfer the printing composition pattern on the blanket roll to the printed material.

As described above, when the cliché is cleaned by bringing the cleaning cloth containing a cleaning solution in contact with the uneven unit of the cliché roll, a nozzle structure adjusting the pressure, and the like, for spraying and a separate structure to remove the cleaning solution after spraying are not required comparing to the case in which the cliché roll is cleaned by spraying a cleaning solution.

In addition, when a cleaning solution is sprayed, larger volume of the cleaning solution than the volume actually required is needed since it is difficult to supply the cleaning solution to the exact location that needs the cleaning, however, when the cliché is cleaned by bringing the cleaning cloth containing a cleaning solution in contact with the uneven unit of the cliché roll, the use of the cleaning solution can be minimized since the cleaning solution can be supplied to the exact location that needs the cleaning.

In addition to this, when a cleaning solution is sprayed, it takes time to dry the cleaning solution, therefore, a continuous process, which is one of the embodiments of the present invention, is not favorable, however, when the cliché is cleaned by bringing the cleaning cloth containing a cleaning solution in contact with the uneven unit of the cliché roll, a separate drying time is not required, therefore, a continuous process is favorable.

When the cleaning cloth is in a dry state containing an adhesive ingredient instead of containing a cleaning solution, there are problems such that the cloth in a dry state may directly touch the cliché roll and damage the uneven unit of the cliché roll, and when cleaning is carried out with a foreign substance adhered to the adhesive ingredient, the foreign substance remains in the cliché roll by being inversely transferred thereto.

However, when the cleaning cloth directly contains a cleaning solution, the cleaning solution is acting as a lubricating oil, and damage to the cliché roll may be prevented by reducing the friction between the cliché roll and the cleaning cloth.

In the embodiment, the cleaning cloth may be a material that can contain a cleaning solution.

The cleaning cloth that can contain the cleaning solution may be a polyester-quality fiber.

In the embodiment, the support of the cliché roll cleaning unit may be a roll type.

In the embodiment, the cleaning cloth providing unit and the cleaning cloth recovery unit may be included.

The cleaning cloth providing unit and the cleaning cloth recovery unit may be a cleaning cloth unwinding roll and the cleaning cloth rewinding unit, respectively. The cleaning cloth recovered by the cleaning cloth recovery unit may be discarded or reused after going through a separate cleaning process.

After the cleaning solution is supplied to the cleaning cloth, the cleaning solution and a cleaning liquid can be in contact with the uneven unit of the cliché in consecutive order by supplying the cleaning liquid to the cleaning cloth, which can remove the cleaning solution for certain. The cleaning liquid may be distilled water, or a liquid having larger volatility than a cleaning solution, for example, acetone or ethanol.

In the embodiment, the cleaning solution supply unit may be included.

The cleaning solution supply unit may include a cleaning solution spray nozzle.

The support of the cliché roll cleaning unit may include the cleaning solution supply unit.

The cleaning solution spray nozzle may provide a cleaning solution to the cleaning cloth supported by the roll cleaning unit support.

The cleaning solution supply unit may supply the cleaning solution by being in contact with the cleaning solution or spraying the cleaning solution to the cleaning cloth.

When the cleaning cloth is supplied by spraying a cleaning solution through the cleaning solution supply unit, the cleaning cloth maintains to be in a dry state until the unwinding roll is in contact with the cliché roll, and contains the cleaning solution by the cleaning solution supply nozzle when being in contact with the cliché roll, therefore, it is advantageous in that the period that the cleaning solution is exposed to the working environment is short.

The cleaning cloth recovery unit may include a cleaning unit that cleans the cleaning cloth and a drying unit that dries the cleaned cleaning cloth.

The drying unit may dry the cleaning cloth by injecting air thereto.

The cleaning cloth recovery unit may supply the cleaned cleaning cloth to a cleaning cloth supply unit again after the cleaning cloth is cleaned.

One example according to the second embodiment is illustrated in FIG. 10. The printing apparatus of FIG. 10 may be constituted to carry out the same processes as the coating, the transferring and the removing processes carried out by the cliché roll, the blanket roll and the printed unit in FIG. 1, however, in the cleaning of the cliché roll, the cleaning cloth contains the cleaning solution by the cleaning solution supplied from the cleaning solution supply nozzle of the cleaning solution supply unit when the cleaning cloth is supplied from the cleaning cloth supply unit and reached the area touching the cliché roll. An ink fragment smeared to the cliché roll is wiped off by the cleaning cloth containing the cleaning solution touching the cliché roll, and after that, the cleaning cloth is recovered by the cleaning cloth recovery unit.

FIG. 10 shows the apparatus in which coating a printing composition on a blanket roll, removing part of the printing composition on the blanket roll and transferring the printing composition pattern to a printed material are all carried out simultaneously, however, in the second embodiment, as is illustrated relating to the first embodiment, it also can be constituted that the processes described above may be carried out separately, or any two processes are carried out simultaneously.

In the second embodiment, as for the descriptions on the blanket roll, the coating unit, the cliché roll and the printed unit, the descriptions on those relating to the first embodiment may be applied.

A reverse offset printing apparatus according to a third embodiment described in the present specification includes a blanket roll; a coating unit provided to coat a printing composition on the blanket roll; a cliché film that includes an uneven unit provided to form a pattern by being in contact with the outer peripheral surface of the blanket roll, and removing part of the printing composition coated on the blanket roll; a roll-type cliché support supporting the cliché film while the cliché film removes part of the printing composition coated on the blanket roll; a cliché film providing unit that provides the cliché film on the roll-type cliché support; a cliché film recovery unit that recovers the cliché film in which a pattern is formed by removing part of the printing composition coated on the blanket roll; and a printed unit equipped with a printed material, and provided to transfer the printing composition pattern on the blanket roll to the printed material.

In the third embodiment, a cliché film, a roll-type cliché support, a cliché film providing unit and a cliché film recovery unit are included instead of the cliché roll of the first embodiment.

The cliché film is a resin film including an uneven unit. Materials of the cliché film is not limited as long as the film is flexible so that it can be supported by a roll-type cliché support, and includes an uneven unit to remove the printing composition on the blanket roll.

The cliché film providing unit and the cliché film recovery unit may be a cliché film unwinding roll and a cliché film rewinding unit, respectively. By this constitution, continuous printing can be carried out without the cleaning of the cliché while printing. The cliché film recovered by the cliché film recovery unit may be discarded or reused after going through a separate cleaning process.

One example according to the third embodiment is illustrated in FIG. 9. In FIG. 9, a printing composition pattern is formed by removing part of the printing composition on the blanket roll in an area which the cliché film provided by the cliché film providing unit is supported by the roll-type cliché support. The cliché film used to remove part of the printing composition is recovered by the cliché film recovery unit. Subsequently, the printing composition pattern on the blanket roll is transferred to a printed material on the printed unit.

FIG. 9 shows the apparatus in which coating a printing composition on a blanket roll, removing part of the printing composition on the blanket roll by the cliché film and transferring the printing composition pattern to a printed material are all carried out simultaneously, however, in the third embodiment, as is illustrated relating to the first embodiment, it also can be constituted that the processes described above may be carried out separately, or any two processes are carried out simultaneously.

In the third embodiment, as for the descriptions on the blanket roll, the coating unit and the printed unit, the descriptions on those relating to the first embodiment may be applied. In addition, as for the descriptions on the cliché film supported by the roll-type support, the descriptions on the cliché roll of the first embodiment may be applied.

A fourth embodiment described in the present specification provides a reverse offset printing method including the steps of coating a printing composition on a blanket roll; forming a printing composition pattern by bringing a cliché roll that includes an uneven unit in contact with the outer peripheral surface of the blanket roll coated with the printing composition, and removing part of the printing composition coated on the blanket roll; cleaning the uneven unit of the cliché roll with a cleaning solution injected from a cleaning solution injection unit while the cliché roll including the uneven unit forms the printing composition pattern by removing part of the printing composition coated on the blanket roll, and removing the cleaning solution by a vacuum suction unit; and transferring the printing composition on the blanket roll to a printed material.

In the fourth embodiment, coating a printing composition on a blanket roll, removing part of the printing composition coated on the blanket roll, and transferring the printing composition on the blanket roll to a printed material may be carried out simultaneously, but each process may also be carried out separately, or any two processes may be carried out simultaneously. In this case, when part of the processes are carried out separately, the step of moving the cliché roll, the blanket roll or the printed unit to a place where each step is carried out may be additionally included in between the processes.

The fourth embodiment may be carried out using the printing apparatus according to the first embodiment, and the descriptions relating to the first embodiment may be applied.

A fifth embodiment described in the present specification provides a reverse offset printing method including the steps of coating a printing composition on a blanket roll; forming a printing composition pattern by bringing a cliché roll that includes an uneven unit in contact with the outer peripheral surface of the blanket roll coated with the printing composition, and removing part of the printing composition coated on the blanket roll; cleaning the uneven unit of the cliché roll using a cleaning cloth containing a cleaning solution and a support that brings the cleaning cloth in contact with the uneven unit of the cliché roll while the cliché roll including the uneven unit forms the printing composition pattern by removing part of the printing composition coated on the blanket roll; and transferring the printing composition on the blanket roll to a printed material.

In the fifth embodiment, coating a printing composition on a blanket roll, forming a printing composition pattern by removing part of the printing composition coated on the blanket roll, and transferring the printing composition on the blanket roll to a printed material may be carried out simultaneously, but each process may also be carried out separately, or any two processes may be carried out simultaneously. In this case, when part of the processes are carried out separately, the step of moving the cliché roll, the blanket roll or the printed unit to a place where each step is carried out may be additionally included in between the processes.

The fifth embodiment may be carried out using the printing apparatus according to the second embodiment, and the descriptions relating to the second embodiment may be applied.

A sixth embodiment described in the present specification provides a reverse offset printing method including the steps of coating a printing composition on a blanket roll; providing a cliché film that includes an uneven unit on a roll-type cliché support, forming a printing composition pattern by bringing the cliché film that includes the uneven unit in contact with the outer peripheral surface of the blanket roll coated with the printing composition and removing part of the printing composition coated on the blanket roll, and then recovering the cliché film including the uneven unit; and transferring the printing composition remaining on the blanket roll to a printed material.

In the sixth embodiment, coating a printing composition on a blanket roll, forming a printing composition pattern by removing part of the printing composition coated on the blanket roll, and transferring the printing composition on the blanket roll to a printed material may be carried out simultaneously, but each process may also be carried out separately, and any two processes may be carried out simultaneously. In this case, when part of the processes are carried out separately, the step of moving the cliché roll, the blanket roll or the printed unit to a place where each step is carried out may be additionally included in between the processes.

The sixth embodiment may be carried out using the printing apparatus according to the third embodiment, and the descriptions relating to the third embodiment may be applied.

The invention claimed is:

1. A reverse offset printing apparatus comprising:
a blanket roll;
a coating unit provided to coat a printing composition on the blanket roll;
a cliché roll that includes an uneven unit provided to form a pattern by being in contact with the outer peripheral surface of the blanket roll, and removing part of the printing composition coated on the blanket roll;
a cliché roll cleaning unit provided to clean the uneven unit of the cliché roll while the cliché roll removes part of the printing composition coated on the blanket roll, which includes a cleaning solution injection unit, a cleaning solution drainage unit, a guide unit, and a vacuum suction unit; and
a printing unit, provided to transfer the printing composition pattern on the blanket roll to the to-be-printed-on material, wherein the printing unit is equipped with the to-be-printed-on material,
wherein the cleaning solution injection unit, the cleaning solution drainage unit and the vacuum suction unit are located in the guide unit,
wherein the vacuum suction unit is located downstream from, and adjacent to, the cleaning solution drainage unit in a rotation direction of the cliché roll, such that the vacuum suction unit and the cleaning solution drainage unit are spaced apart by a portion of the guide unit, and
wherein a distance between the vacuum suction unit and the cleaning solution drainage unit is greater than or equal to 2 cm and less than or equal to 20 cm.

2. The reverse offset printing apparatus of claim 1, wherein the blanket roll is disposed at a place where the outer peripheral surface borders each of the cliché roll and the to-be-printed-on material installed on the printing unit, which is also a place where coating is carried out by the coating unit.

3. The reverse offset printing apparatus of claim 1, wherein the blanket roll is disposed to be movable between a place where coating is carried out by the coating unit, and a place where the outer peripheral surface borders each of the cliché roll and the to-be-printed-on material installed on the printing unit.

4. The reverse offset printing apparatus of claim 1, wherein the blanket roll is disposed to be movable between a place where coating is carried out by the coating unit, a place where the outer peripheral surface borders the cliché roll, and a place where the outer peripheral surface borders the to-be-printed-on material installed on the printed unit.

5. The reverse offset printing apparatus of claim 1, wherein the blanket roll is disposed to be movable between a place where the outer peripheral surface borders the cliché roll, which is also a place where coating is carried out by the coating unit, and a place where the outer peripheral surface borders the to-be-printed-on material installed on the printing unit.

6. The reverse offset printing apparatus of claim 1, wherein the cliché roll includes a roll-type support in which an uneven unit is formed on an outer peripheral surface.

7. The reverse offset printing apparatus of claim 1, wherein the cliché roll includes a roll-type support and a resin film having an uneven unit adhered to an outer peripheral surface of the roll-type support.

8. The reverse offset printing apparatus of claim 7, wherein the cliché roll includes one, two or more roll-type supports.

9. The reverse offset printing apparatus of claim 1, wherein the printed unit further includes a printed material providing unit and a printed material recovery unit, which continuously or intermittent-continuously provides and recovers a printed material.

10. The reverse offset printing apparatus of claim 1, further comprising:
a control unit adjusting a rotation speed of the cliché roll and the blanket roll so that a moving speed at a contact point of the cliché roll and the blanket roll is the same.

11. The reverse offset printing apparatus of claim 1, further comprising:
a control unit adjusting a rotation speed of the blanket roll and the printing unit so that a moving speed at a contact point of the blanket roll and the to-be-printed-on material installed on the printing unit is the same,
wherein the printing unit is a roll type.

12. A reverse offset printing method comprising the steps of:
providing the reverse offset printing apparatus of claim 1;

coating the printing composition on the blanket roll;
forming a printing composition pattern by bringing the cliché roll that includes an uneven unit in contact with the outer peripheral surface of the blanket roll coated with the printing composition, and removing part of the printing composition coated on the blanket roll;
cleaning the uneven unit of the cliché roll with a cleaning solution injected from the cleaning solution injection unit while the cliché roll including the uneven unit forms the printing composition pattern by removing part of the printing composition coated on the blanket roll, and removing the cleaning solution by the vacuum suction unit; and
transferring the printing composition on the blanket roll to the to-be-printed-on material.

\* \* \* \* \*